US008076211B2

(12) United States Patent
Pirovano et al.

(10) Patent No.: US 8,076,211 B2
(45) Date of Patent: Dec. 13, 2011

(54) FABRICATING BIPOLAR JUNCTION SELECT TRANSISTORS FOR SEMICONDUCTOR MEMORIES

(75) Inventors: Agostino Pirovano, Corbetta (IT); Augusto Benvenuti, Lallio (IT); Fabio Pellizzer, Cornate D'Adda (IT); Giorgio Servalli, Ciserano (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/912,829

(22) Filed: Oct. 27, 2010

(65) Prior Publication Data

US 2011/0039391 A1 Feb. 17, 2011

Related U.S. Application Data

(62) Division of application No. 12/341,027, filed on Dec. 22, 2008, now Pat. No. 7,847,373.

(51) Int. Cl.
*H01L 21/8222* (2006.01)
*H01L 21/331* (2006.01)
(52) U.S. Cl. ... 438/340; 438/369; 438/514; 257/E21.35; 257/E21.608

(58) Field of Classification Search .................. 438/340, 438/369, 514; 257/E21.35, E21.608
See application file for complete search history.

(56) References Cited

U.S. PATENT DOCUMENTS

| 4,466,178 | A * | 8/1984 | Soclof ............................ 438/337 |
| 6,235,610 | B1 * | 5/2001 | Nicotra et al. ................. 438/433 |
| 6,559,023 | B2 * | 5/2003 | Otsuki et al. ................... 438/342 |
| 6,822,297 | B2 * | 11/2004 | Nandakumar et al. ......... 257/356 |
| 7,268,412 | B2 * | 9/2007 | Verma et al. ................... 257/565 |
| 7,687,907 | B2 * | 3/2010 | Okuda et al. ................... 257/737 |
| 2006/0252216 | A1 * | 11/2006 | Dokumaci et al. ............. 438/312 |
| 2010/0035421 | A1 * | 2/2010 | Denison et al. ................ 438/514 |
| 2010/0127306 | A1 * | 5/2010 | Okuda et al. ................... 257/139 |

* cited by examiner

*Primary Examiner* — Ngan Ngo
(74) *Attorney, Agent, or Firm* — Trop, Pruner & Hu, P.C.

(57) ABSTRACT

A bipolar junction transistor may act as a select device for a semiconductor memory. The bipolar junction transistor may be formed of a stack of base and collector layers. Sets of parallel trenches are formed in a first direction down to the base and in a second direction down to the collector. The trenches may be used to form local enhancement implants into the exposed portion of the base and collector in each trench. As a result of the local enhancement implants, in some embodiments, leakage current may be reduced, active current capability may be higher, gain may be higher, base resistance may be reduced, breakdown voltage may be increased, and parasitic effects with adjacent junctions may be reduced.

10 Claims, 2 Drawing Sheets

FABRICATING BIPOLAR JUNCTION SELECT TRANSISTORS FOR SEMICONDUCTOR MEMORIES

CROSS-REFERENCE TO RELATED APPLICATIONS

This application is a divisional of U.S. patent application Ser. No. 12/341,027, filed on Dec. 22, 2008 now U.S. Pat. No. 7,847,373.

BACKGROUND

This relates generally to semiconductor memories and, particularly, to the use of bipolar junction transistors for selecting cells in memory arrays of semiconductor memories.

A bipolar junction transistor is an effective selection device for a storage element in an array of memory elements. A bipolar junction transistor may be an effective selection device because it may have better current driving capabilities than an MOS selection device of comparable size. If the memory element requires a significant programming current, as is the case in some memories, such as phase change memories and binary oxide unipolar resistive memories, the adoption of a bipolar junction transistor selector may allow a substantial reduction of cell size.

DETAILED DESCRIPTION

In accordance with some embodiments of the present invention, a memory may be made with a bipolar junction transistor selection device that, in some embodiments, may exhibit lower leakage current, higher active current capability, higher gain, lower base resistance, higher breakdown voltage, and/or lower parasitic effects with adjacent junctions. In some embodiments, reinforcement doping may be provided in the collector and base regions to achieve one or more of those results. The reinforcement doping may be self-aligned and localized at the bottom of shallow trench isolations in some embodiments. The dopants may be implanted after trench opening and before filling. Thus, the requirements for masking may be reduced in some cases. Word line to word line isolation may be enhanced by the collector reinforcement dopants being located between word lines in some embodiments. Base resistance and the gain of parasitic lateral bipolar junction transistors may be improved by locally increasing the word line conductivity in the region between adjacent emitters in some cases. The initial base doping can then be reduced without degrading significantly the overall base resistance while allowing, at the same time, a substantial reduction of base-emitter leakage, in some embodiments. As a result, in some cases, larger memory arrays may be achieved, improving the array efficiency.

Figure 1:
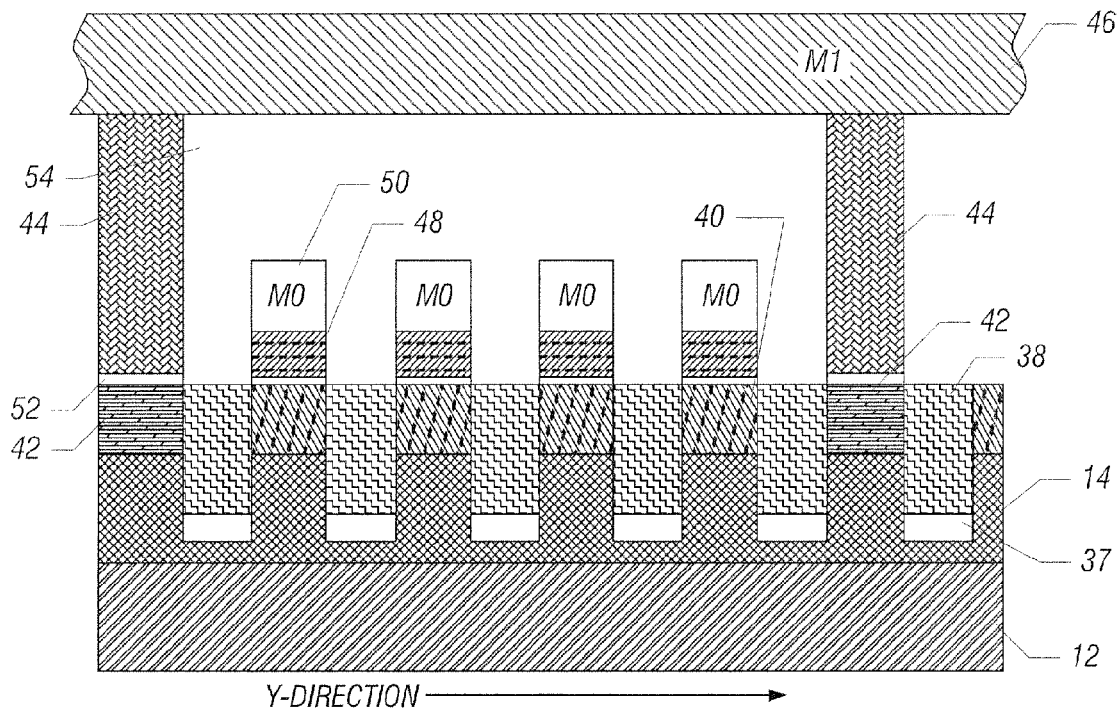
FIG. 1 is an enlarged, partial cross-sectional view in that the Y-direction of one embodiment of the present invention.

Referring to FIG. 1, a semiconductor memory may include storage elements 48. The storage elements may be phase change memory storage elements, binary oxide unipolar resistive memories, or any other semiconductor memory storage element. Each storage element 48 may be coupled on its upper side to a metal interconnect layer 50, such as a metal zero layer, in some embodiments. Each storage element 48 may be coupled on its lower side to an emitter 40 of a bipolar junction transistor through a salicide 52 in one embodiment. The salicide 52 may be a cobalt salicide in one embodiment.

Another metal interconnect layer 46 may be coupled by plugs 44 that extend through an insulator 54 to base contacts 42 of the bipolar junction transistors. In one embodiment, the plugs 44 may be formed of tungsten. The base contacts 42 may be formed on the base 14. The base contacts may be separated from one another in the Y or column direction by shallow trench isolations filled with insulator 38. The insulator 38 may be a spin-on dielectric, high density plasma dielectric, or a sub-atmospheric pressure chemical vapor deposition dielectric, as examples. In one embodiment, the insulator 38 is oxide.

A collector 12 may underlie the base 14 in some embodiments. Collector connections may be made as described hereinafter along the X or word line direction.

Figure 2:
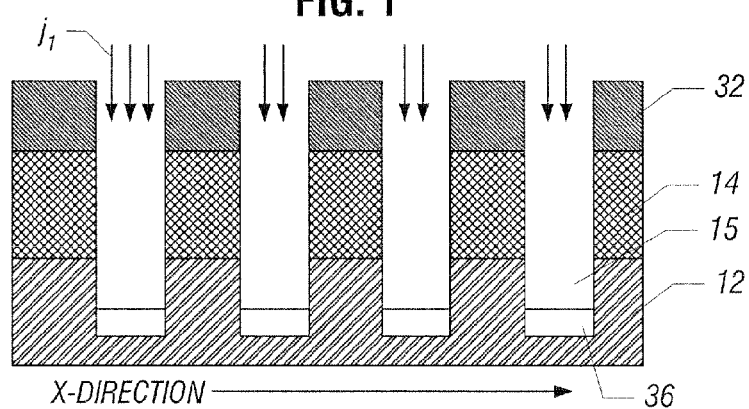
FIG. 2 is an enlarged, partial cross-sectional view of the embodiment shown in FIG. 1 in the X-direction at an early stage of manufacture.

Referring to FIG. 2, and looking along the X or row direction, initially, a plurality of parallel trenches 15 (extending into the page) may be formed through an overlying dielectric 32, the base 14, and the collector 12. In one embodiment, the dielectric 32 may be a nitride dielectric. The entire structure may be subjected to an implant I1. The implant I1 penetrates the collector 12 at the bottom of each trench 15, as indicated at 36. Thus, for example, in the situation where the collector 12 is P-type, the P-type doping of the collector 12 may be enhanced by using a P-type species for the implant I1 (or vice versa for an N-type collector). As a result, local reinforcement of collector doping may be achieved in the self-aligned fashion in some embodiments.

In many embodiments, it may be desirable to use shallower reinforcement implants with increased dose. In some cases, if the amorphization point is reached, then, after recrystallization, a lower defect density may be achieved. In general, additional reinforcement doping is generally desirable, so long as the doping can be achieved without creating too many defects in the final product.

Figure 3:
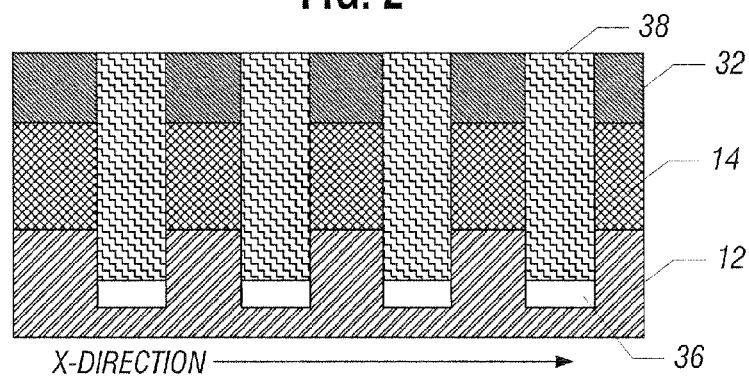
FIG. 3 is an enlarged, partial cross-sectional view at a subsequent stage in the X-direction in accordance with one embodiment.

Next, as shown in FIG. 3, the trenches 15 may be filled with an insulator 38 to form shallow trench isolations. The insulator 38 may be a spin-on dielectric, high density plasma dielectric, or a sub-atmospheric pressure chemical vapor deposition dielectric, as examples. In one embodiment, the insulator 38 is oxide. The insulator 38 may be subjected to chemical mechanical planarization.

Figure 4:
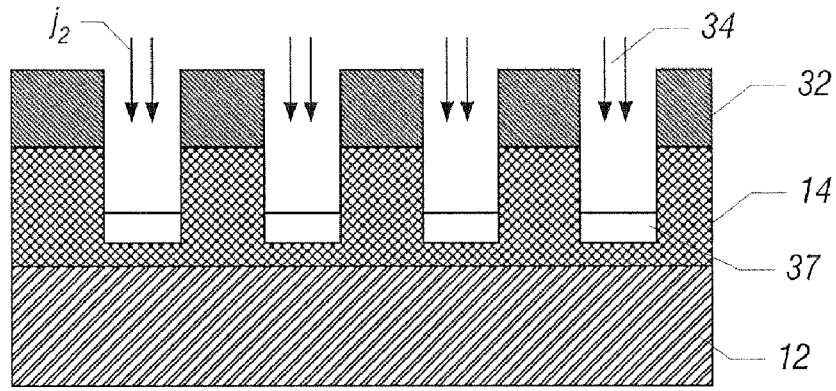
FIG. 4 is an enlarged, partial cross-sectional view at a subsequent stage in the Y-direction in accordance with one embodiment.

As shown in FIG. 4, in the perpendicular, column, or Y-direction, parallel trenches 34 may be formed (extending into the page). These trenches 34 may be formed only through the insulator 32 and into, but not through, the base 14. The trenches 34 may be shallower than the trenches 15 formed previously.

A reinforcement implant I2 is applied across the wafer and into the base 14 via the trenches 34. Of course, the insulator 38 and dielectric 22 prevent any implantation into the collector 12 or underlying layers.

As a result of the implant I2, a local doping enhancement 37 of the base 14 may be achieved. For example, an N-type base may be implanted with N-type local doping enhancement to provide local reinforcement of the base doping (or vice versa for a P-type base). Again, additional reinforcement doping is generally desirable, so long as the doping can be achieved without creating too many defects in the final product.

Figure 5:
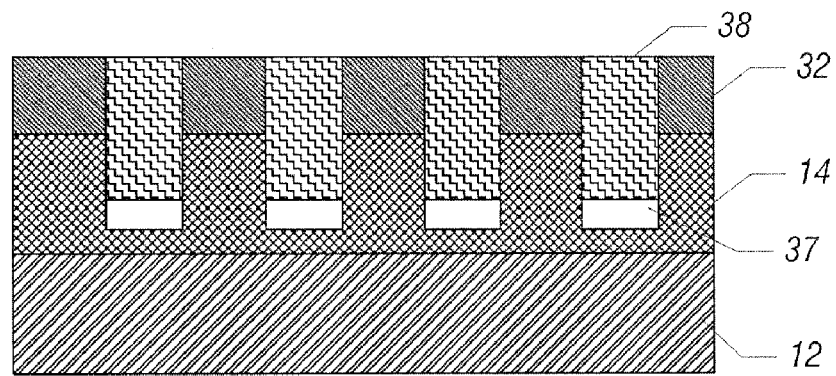
FIG. 5 is an enlarged, partial cross-sectional view at a subsequent stage in the Y-direction in accordance with one embodiment.

Then, as shown in FIG. 5, the trenches 34 may be filled with the insulator 38 to form shallow trench isolations. The insulator 38 may be an oxide, which may be subject to chemical mechanical planarization to achieve the planar surface shown in FIG. 5. Insulators 38 in FIGS. 3 and 5 may be the same or different materials or applied in the same or different ways.

The order of reinforcing the base and then collector can be switched in some embodiments.

Figure 6:
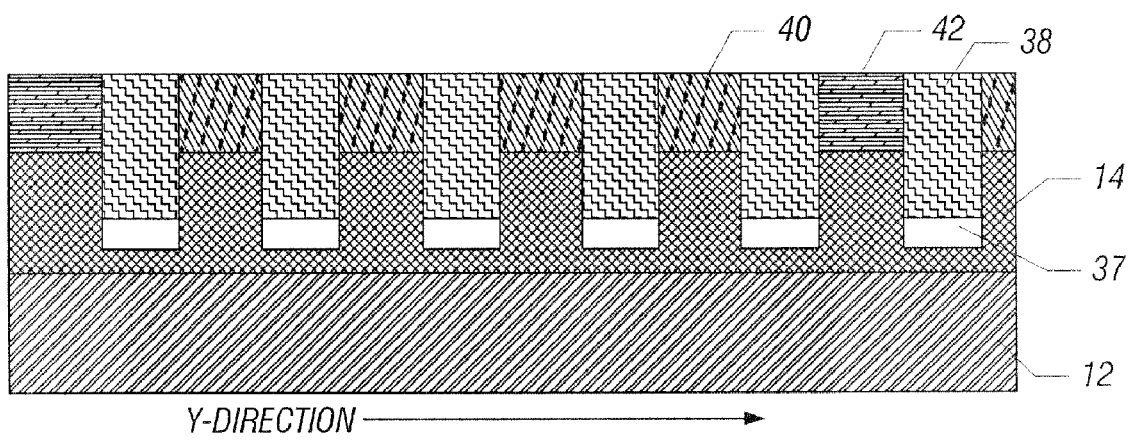
FIG. 6 is an enlarged, partial cross-sectional view at a subsequent stage in the Y-direction in accordance with one embodiment.

Two separate implants may be performed to achieve the structure shown in FIG. 6. One implant may be a P-type shallow implant to form P-type emitters 40. The other implant may be suitably masked to form base contacts 42. In some embodiments, the base contacts 42 may be reinforcement implants of N-type species to facilitate contact with an N-type base 14. However, the base and emitter may be N or P-type.

Then the structure of FIG. 6 may be further processed in conventional fashion to form storage elements 48 and the overlying metal interconnects, for example, as depicted in FIG. 1.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   forming stacked base and collector layers;
   forming first trenches in a first direction to provide local enhancement implants for one of the base and collector layers; and
   forming second trenches in a second direction, different than said first direction, to form local enhancement implants into the other of said base and collector layers.

2. The method of claim 1 including forming said first trenches to the lowermost of said stacked base and collector layers and forming the trenches in the second direction to the uppermost of said stacked base and collector layers.

3. The method of claim 1 including forming said first trenches into the collector.

4. The method of claim 3 including forming said second trenches into the base.

5. The method of claim 1 including filling said trenches in said first direction before forming said trenches in said second direction.

6. The method of claim 1 including forming said base of a first conductivity type and performing local enhancement implants for said base of said first conductivity type.

7. The method of claim 6 including forming said collector of a second conductivity type and performing said local enhancement implant for said collector of said second conductivity type.

8. The method of claim 1 including forming said first and second trenches to different depths.

9. The method of claim 1 including forming emitters and base contacts in regions between said trenches.

10. The method of claim 1 including forming said first trenches by forming a stack of base and collector layers covered by an insulator over said stack.

* * * * *